United States Patent
Hattori et al.

(10) Patent No.: US 6,786,944 B2
(45) Date of Patent: Sep. 7, 2004

(54) AQUEOUS DISPERSION FOR CHEMICAL MECHANICAL POLISHING

(75) Inventors: Masayuki Hattori, Tokyo (JP); Michiaki Ando, Tokyo (JP); Kazuo Nishimoto, Tokyo (JP); Nobuo Kawahashi, Tokyo (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 10/412,385

(22) Filed: Apr. 14, 2003

(65) Prior Publication Data

US 2003/0196386 A1 Oct. 23, 2003

(30) Foreign Application Priority Data

Apr. 22, 2002 (JP) ............................. 2002-119890

(51) Int. Cl.⁷ ..................... C09G 1/02; C09G 1/04; B24B 1/00
(52) U.S. Cl. ................. 51/307; 51/309; 106/3; 438/692; 438/693
(58) Field of Search ............ 51/307, 309; 106/3; 438/692, 693

(56) References Cited

U.S. PATENT DOCUMENTS

| | | |
|---|---|---|
| 4,752,628 A | 6/1988 | Payne |
| 4,867,757 A * | 9/1989 | Payne ............... 51/293 |
| 6,221,118 B1 | 4/2001 | Yoshida et al. |
| 6,343,976 B1 | 2/2002 | Yoshida et al. |
| 6,420,269 B2 | 7/2002 | Matsuzawa et al. |
| 2001/0024933 A1 | 9/2001 | Sachan et al. |
| 2002/0019202 A1 | 2/2002 | Thomas et al. |
| 2002/0025762 A1 | 2/2002 | Luo et al. |
| 2002/0033382 A1 | 3/2002 | Kaufman et al. |
| 2002/0045350 A1 | 4/2002 | Kido et al. |

FOREIGN PATENT DOCUMENTS

| | | |
|---|---|---|
| EP | 0 896 042 | 2/1999 |
| EP | 1 138 734 | 10/2001 |
| WO | WO 99/64527 | 12/1999 |
| WO | WO 01/44396 | 6/2001 |
| WO | WO 02/02706 | 1/2002 |

* cited by examiner

*Primary Examiner*—Michael Marcheschi
(74) *Attorney, Agent, or Firm*—Oblon, Spivak, McClelland, Maier & Neustadt, P.C.

(57) ABSTRACT

An aqueous dispersion for chemical mechanical polishing that is hard to putrefy, scarcely causes scratches, causes only small dishing and is suitable for used in a micro isolating step or a planarizing step of an inter layer dielectric in production of semiconductor devices, which dispersion comprises ceria particles, a preservative composed of a compound having a heterocyclic structure containing a nitrogen atom and a sulfur atom in the ring, such as an isothiazolone compound, and an organic component such as organic abrasive grains composed of resin particles, a dispersing agent composed of a water-soluble polymer having a specific molecular weight or the like, a surfactant and/or an organic acid or a salt thereof contained in an aqueous medium, wherein the ceria particles, preservative and organic component are contained in proportions of 0.1 to 20% by mass, 0.001 to 0.2% by mass and 0.1 to 30% by mass, respectively, when the total proportion of the aqueous medium, ceria particles, preservative and organic component is 100% by mass, and wherein the pH of this aqueous dispersion can be kept in a neutral range.

20 Claims, No Drawings

AQUEOUS DISPERSION FOR CHEMICAL MECHANICAL POLISHING

BACKGROUND OF THE INVENTION

1. Field of the Invention

The present invention relates to an aqueous dispersion for chemical mechanical polishing, i.e. a polishing slurry for chemical mechanical polishing, and particularly to an aqueous dispersion for chemical. mechanical polishing that is used in a production process of semiconductor devices, resistive to putrefy, scarcely causes scratches and able to form a sufficiently planarized polished surface. The present invention can be utilized in production of semiconductor devices and is useful in, particularly, a micro isolating step and planarizing step of an inter layer dielectric.

2. Description of the Background Art

With the increase of the degree of integration and the formation of multi-layer wiring in semiconductor devices, a memory capacity of memory devices is increasing by leaps and bounds. This is supported by the advancement of micronization of a processing technique. However, a chip size is enlarged in spite of the formation of multi-layer wiring, and the number of steps is increased with the micronization to incur an increase in chip cost. Under the circumstances, a technique of chemical mechanical polishing is introduced for polishing of a film to be processed or the like in the production of a semiconductor device and attracts attention. A great number of micronized techniques such as planarization are embodied by applying this chemical mechanical polishing technique.

As this micronized technique, is known, for example, micro isolation, such as STI (shallow trench isolation) technique (Japanese Patent Application Laid-Open No. 22970/1996 and the like). Various kinds of aqueous dispersions (herein after may be referred to as "polishing slurries" or "polishing slurry") for chemical mechanical polishing are used in this micronized technique. In recent years, organic additives have been often contained or incorporated in the polishing slurries for the purpose of improving the polishing performance thereof, and so the polishing slurries are susceptible to be putrefied. Thus, a countermeasure such as to make a polishing slurry strongly acidic or strongly alkaline, or to contain a component for inhibiting putrefaction into the polishing slurry has been taken. For example, hydrogen peroxide or the like is used as the component for inhibiting putrefaction. Further, in the technique described in Japanese Patent Application Laid-Open No. 197575/1991, tetraalkylammonium chloride, tetraalkylammonium hydroxide or the like is contained as a biocide into colloidal silica.

However, a polishing slurry for chemical mechanical polishing containing ceria particles used in the STI technique in particular is generally used in a neutral range, and so there is a limitation to the inhibition of putrefaction by control of pH. The use of hydrogen peroxide fails to retain the action and effect thereof as a preservative over a long period of time, so that putrefaction may progress in the interior of an polish slurry feeding device at a position used in some cases. The other preservatives heretofore used, such as tetraalkylammonium chloride cause scratches and can not prevent dishing although they have anti-putrefaction effect, therefore, they are poor in performance balance.

SUMMARY OF THE INVENTION

The present invention has been made for the purpose of solving the above-described problems involved in the prior art and has as its object the provision of an aqueous dispersion for chemical mechanical polishing which does not putrefy even in a neutral range, scarcely causes scratches upon use and able to form a sufficiently planarized polished surface.

According to the present invention, there is provided an aqueous dispersion for chemical mechanical polishing comprising ceria particles, a preservative composed of a compound having a heterocyclic structure containing a nitrogen atom and a sulfur atom in the ring and another, organic component than the preservative, contained in an aqueous medium, wherein the ceria particles, preservative and organic component are contained in proportions of 0.1 to 20% by mass, 0.001 to 0.2% by mass and 0.1 to 30% by mass, respectively, when the total proportion of the aqueous medium, ceria particles, preservative and organic component is 100% by mass.

In the above aqueous dispersion, the ceria particles may preferably have an average particle diameter of 0.01 to 3 $\mu$m.

The preservative may preferably be an isothiazolone compound.

The organic component may preferably be at least one of organic abrasive grains composed of resin particles, a water-soluble polymer having a molecular weight of at least 100, an organic acid or a salt thereof and a surfactant.

The aqueous dispersion for chemical mechanical polishing may preferably have a pH of 4 to 10.

The aqueous dispersion for chemical mechanical polishing may preferably be used in dilution at a dilution rate of at least 2 times with the aqueous medium upon use.

The aqueous dispersion for chemical mechanical polishing may preferably be used in a micro isolating step or a planarizing step of an inter layer dielectric in production of semiconductor devices.

DETAILED DESCRIPTION OF THE PREFERRED EMBODIMENTS

The aqueous dispersion or polishing slurry for chemical mechanical polishing according to the present invention comprises ceria particles, a preservative composed of a compound having a heterocyclic structure containing a nitrogen atom and a sulfur atom in the ring and another organic component than the preservative in respective specific proportions in an aqueous medium.

The above "ceria particles" include particles obtained by calcining particles of cerium carbonate, cerium hydroxide, cerium oxalate or the like. Among these particles, ceria particles obtained by calcining cerium carbonate are particularly preferred.

Only the ceria particles may be contained incorporated as inorganic abrasive grains into the aqueous medium, or other inorganic abrasive grains may also be used in combination. Examples of the other inorganic abrasive grains include silica particles, alumina particles, zirconia particles and titania particles. These other inorganic abrasive grains may be used either singly or in any combination thereof. When the other inorganic abrasive grains are contained, the proportion of the ceria particles is preferably at least 20% by mass, particularly at least 50% by mass when the total proportion of the inorganic abrasive grains is 100% by mass.

No particular limitation is imposed on the average particle diameter of the ceria particles. However, the average particle diameter is preferably 0.01 to 3 $\mu$m. A polishing slurry that a precipitation of the particles is controlled and it's dispersed state is stable and, high in polishing speed, i.e. removal rate, may be provided so far as the ceria particles have an average particle diameter within this range. If the average particle diameter is smaller than 0.01 µm, there is a tendency in a polishing slurry that the removal rate to become insufficient. If the average particle diameter exceeds 3 µm on the other hand, ceria particles tend to precipitate, and it is not easy to provide a stable polishing slurry. The average particle diameter of the ceria particles is more preferably 0.02 to 1.5 µm, particularly 0.03 to 1 µm, still particularly 0.05 to 0.7 µm. When the other inorganic abrasive grains are used in combination, the average particle diameter of such particles is preferably substantially equal to that of the ceria particles.

The average particle diameter of the particles can be measured by means of a dynamic light scattering measuring device, laser scattering diffraction measuring device or the like, or may also be measured by observation through a transmission type electron microscope. In addition, the average particle diameter may also be calculated out on the basis of the specific surface area of the ceria particles measured by drying and powdering them.

The amount of the ceria particles contained into the polishing slurry is 0.1 to 20% by mass when the total proportion of the aqueous medium, ceria particles, preservative and organic component is 100% by mass. This amount contained is preferably to 0.5 to 20% by mass, particularly 1 to 15% by mass, still particularly 2 to 12% by mass. If the amount of the ceria particles contained is less than 0.1% by mass, polishing slurry having sufficient removal rate cannot be provided. If this amount contained exceeds 20% by mass on the other hand, the ceria particles tend to precipitate, and the redispersion of the precipitate becomes difficult. It is hence not preferable to contain the ceria particles in such a small or great amount.

As the "preservative composed of a compound having a heterocyclic structure containing a nitrogen atom and a sulfur atom in the ring", may be used any of various kinds of heterocyclic compounds that have a preservative property and an effect to prevent putrefaction of a polishing slurry even in the neutral range, and can sufficiently control to restrain scratches and dishing.

As this preservative, is preferred an isothiazolone compound. Examples of the isothiazolone compound include 1,2-benzoisothiazol-3-one, 5-chloro-2-methyl-4-isothiazol-3-one, 2-methyl-4-isothiazol-3-one, 5-chloro-2-phenethyl-3-isothiazolone, 4-bromo-2-n-dodecyl-3-isothiazolone, 4,5-dichloro-2-n-octyl-3-isothiazolone, 4-methyl-5-chloro-2-(4'-chlorobenzyl)-3-isothiazolone, 4,5-dichloro-2-(4'-chlorobenzyl)-3-isothiazolone, 4,5-dichloro-2-(4'-chlorophenyl)-3-isothiazolone, 4,5-dichloro-2-(2'-methoxy-3'-chlorophenyl)-3-isothiazolone, 4,5-dibromo-2-(4'-chlorobenzyl)-3-isothiazolone, 4-methyl-5-chloro-2-(4'-hydroxyphenyl)-3-isothiazolone, 4,5-dichloro-2-n-hexyl-3-isothiazolone and 5-chloro-2-(3',4'-dichlorophenyl)-3-isothiazolone. Among these isothiazolone compounds, 1,2-benzoisothiazol-3-one, 5-chloro-2-methyl-4-isothiazol-3-one and 2-methyl-4-isothiazol-3-one are particularly preferred.

The isothiazolone compounds may be used either singly or in any combination thereof.

The amount of the preservative contained into the polishing slurry varies according to the kind thereof. However, it is generally 0.001 to 0.2% by mass when the total proportion of the aqueous medium, ceria particles, preservative and organic component is 100% by mass. This amount contained is preferably 0.001 to 0.17% by mass, particularly 0.02 to 0.15% by mass, still particularly 0.003 to 0.12% by mass. If the amount of the preservative contained is less than 0.001% by mass, a necessary preservative effect cannot be achieved. If this amount contained exceeds 0.2% by mass on the other hand, it involves problems that polishing performance such as removal rate or the like is deteriorated, and the treatment of a waste water becomes difficult. It is hence not preferable to contain the preservative in such a small or great amount.

Examples of the above "organic component" include organic abrasive grains used in combination with the ceria particles, dispersing agents, surfactants, organic acids or salts thereof, urea and urea derivatives.

These organic components may be used either singly or in any combination of two or more different kinds of organic components.

As the organic abrasive grains, may be used particles composed of any of various kinds of resins. Occurrence of scratches can be controlled to restrain by the organic abrasive grains and more planarized polished surface can be formed. Any of a thermoplastic resin and a thermosetting resin may be used as the resin forming the organic abrasive grains.

Examples of the thermoplastic resin include polyvinyl chloride, polystyrene, styrene copolymers, polyacetal, saturated polyester, polyamide, polycarbonate, polyolefins such as polyethylene, polypropylene, poly(1-butene) and poly(4-methyl-2-pentene), olefin copolymers, phenoxy resins, poly(meth)acrylic acid such as poly(methyl methacrylate), poly(meth)acrylate, (meth)acrylic acid copolymers and (meth)acrylate copolymers.

Examples of the thermosetting resin include phenol resins, urea resins, melamine resins, epoxy resins, alkyd resins and unsaturated polyester resins. As the resin, may also be used a copolymer resin having a crosslinked structure obtained by copolymerizing a styrenic monomer and a (meth)acrylate monomer or the like with a monomer having two or more of polymerizable unsaturated groups such as divinyl benzene, ethyleneglycol dimethacrylate, and the like.

These resins can be prepared by an emulsion polymerization process, suspension polymerization process or the like. The organic abrasive grains can be prepared by an emulsion dispersion process, grinding process or the like.

The organic abrasive grains may be used either singly or in any combination thereof.

No particular limitation is imposed on the average particle diameter of the organic abrasive grains. However, the average particle diameter is preferably 0.01 to 3 µm. A surface for polishing can be planarized in further degree so far as the organic abrasive grains have an average particle diameter within this range. In addition, such organic abrasive grains are excellent in redispersivity as they do not form a hard precipitated layer even if they precipitate, so that a polishing slurry for chemical mechanical polishing stable in dispersivity can be provided. If the average particle diameter of the organic abrasive grains is smaller than 0.01 µm, a ratio of the rate of polishing a silica film to the rate of polishing a silicon nitride film becomes low in use for STI, so that selectivity may not be sufficiently improved in some cases. If the average particle diameter exceeds 3 µm on the other hand, organic abrasive grains tend to precipitate, and it is not easy to provide a stable polishing slurry. The average particle diameter of the organic abrasive grains is more preferably 0.02 to 1.0 µm, particularly 0.04 to 0.7 µm. The average particle diameter of the organic abrasive grains can be measured in the same manner as in the case of the inorganic abrasive grains.

As the dispersing agent which is the organic component, may be used any of an anionic dispersing agent, a cationic dispersing agent, a nonionic dispersing agent and the like. By containing the dispersing agent, not only the abrasive grains can be more uniformly dispersed, but also dishing can be made small as a result of the improvement of planarizing performance. As the dispersing agent, is preferred a water-soluble polymer having a molecular weight of at least 100. Examples of the water-soluble polymer include polyacrylic acid, polymethacrylic acid, polyacrylamide, polystyrene-sulfonic acid, sulfonated polyisoprene, polyvinyl alcohol, polyvinyl pyrrolidone, copolymers obtained by using at least 2 of the monomers forming these respective polymers, and salts of these polymers and copolymers, such as alkali metal salts. As the water-soluble polymers, may also be used cellulose derivatives such as carboxymethyl cellulose, hydroxyethyl cellulose, hydroxypropyl cellulose, methyl cellulose, ethyl cellulose and ethylhydroxyethyl cellulose, and salts thereof, such as alkali metal salts.

These dispersing agents may be used either singly or in any combination thereof.

As the surfactant which is the organic component, may be used any of an anionic surfactant, a cationic surfactant, an amphoteric surfactant and a nonionic surfactant. These surfactants have an action to prevent scratches.

Examples of the anionic surfactant include carboxylic acid salts such as fatty acid soap and alkyl ether carboxylic acid salts, sulfonic acid salts such as alkyl benzene sulfonic acid salts, alkyl naphthalene sulfonic acid salts and α-olefinsulfonic acid salts, sulfate salts such as higher alcohol sulfate salts, alkyl ether sulfate salts and polyoxyethylene alkyl phenyl ether sulfate salts, and phosphate salts such as alkyl phosphate salts. Examples of the salts include ammonium salts, potassium salts and sodium salts, with ammonium salts and potassium salts being particularly preferred. Besides, sulfonic acid salts are more preferred, with sulfonic acid salts such as potassium dodecylbenzene-sulfonate and ammonium dodecylbenzene-sulfonate being particularly preferred.

Examples of the cationic surfactant include lauryltrimethylammonium chloride, stearyltrimethylammonium chloride, cetyltrimethylammonium chloride, distearyldimethylammonium chloride, dialkyl(12–18) dimethylammonium chloride, alkylimidazoline and benzalkonium chloride solution.

Examples of the amphoteric surfactant include lauryldimethylaminoacetic acid betaine, stearyldimethylaminoacetic acid betaine, 2-alkyl-N-carboxymethyl-N-hydroxyethylimidazolinium betaine, lauric acid amidopropylbetaine, coconut acid amidopropylbetaine, laurylhydroxysulfobetaine and lauryldimethylamine oxide.

Examples of the nonionic surfactant include polyoxyethylene alkylamines, alkylalkanolamides such as palm kernel oil fatty acid diethanolamide and lauric acid diethanolamide, and ethylene oxide adducts of acetylene glycol.

These surfactants may be used either singly or in any combination of two or more different kinds of surfactants.

The polishing slurry can be more stabilized by an organic acid or a salt thereof which is the organic component. Examples of the organic acid or the salt thereof include p-toluenesulfonic acid, dodecylbenzenesulfonic acid, isoprenesulfonic acid, gluconic acid, lactic acid, citric acid, tartaric acid, malic acid, glycolic acid, malonic acid, formic acid, oxalic acid, succinic acid, fumaric acid, maleic acid, phthalic acid and amino acids such as glycine, alanine, glutamic acid and tryptophan, and salts thereof, such as ammonium salts, potassium salts and sodium salts. As the salts, are preferred ammonium salts.

These organic acids or the salts thereof may be used either singly or in any combination thereof.

As the organic component, may also be used urea and urea derivatives such as alkylurea. These compounds may be used either singly or in any combination thereof.

The amount of the organic component contained into the polishing slurry is 0.1 to 30% by mass when the total proportion of the aqueous medium, ceria particles, preservative and organic component is 100% by mass. This amount contained is preferably 0.5 to 30% by mass, particularly 1 to 25% by mass, still particularly 3 to 25% by mass. It is preferred that the amount be controlled to a proper amount according to the kind of the organic component used. The amount of the organic abrasive grains is preferably 0.1 to 30% by mass, particularly 1 to 25% by mass. The amount of the water-soluble polymer as the dispersing agent is preferably 0.1 to 30% by mass, particularly 1 to 25% by mass. The amount of the surfactant is preferably 0.1 to 30% by mass, particularly 0.5 to 20% by mass. The amount of the organic acid or the salt thereof is preferably 0.1 to 30% by mass, particularly 1 to 25% by mass.

If the amount of the organic component contained is less than 0.1% by mass, the particular action and effect brought about by containing the organic component cannot be sufficiently achieved. If this amount contained exceeds 30% by mass on the other hand, the viscosity of the resulting polishing slurry is extremely increased, and the flowability thereof is almost lost. It is hence not preferable to contain the organic component in such a small or great amount.

In embodiments of the polishing slurry, it is preferred that the ceria particles, preservative and organic component be contained in proportions of 0.5 to 20% by mass, 0.002 to 0.17% by mass and 0.5 to 30% by mass, respectively, when the total proportion of the aqueous medium, ceria particles, preservative and organic component is 100% by mass. It is more preferred that the ceria particles, preservative and organic component be contained in proportions of 1 to 15% by mass, 0.002 to 0.15% by mass and 1 to 25% by mass, respectively. It is particularly preferred that the ceria particles, preservative and organic component be contained in proportions of 2 to 12% by mass, 0.003 to 0.12% by mass and 3 to 25% by mass, respectively.

The aqueous dispersion or polishing slurry according to the present invention is used in chemical mechanical polishing at a pH ranging from 2 to 10, particularly from 3 to 10, further from 4 to 10, more preferably from 5 to 9. The ceria particles are contained as abrasive grains into this polishing slurry, and the polishing slurry is generally used in a neutral range. However, the polishing slurry can be sufficiently prevented from putrefying and stably stored and used because the preservative composed of the specific compound having a heterocyclic structure containing a nitrogen atom and a sulfur atom in the ring is contained. Accordingly, the polishing slurry is useful in the production of semiconductor devices and suitable for use as a polishing slurry for chemical mechanical polishing in an STI step and a planarizing step of an inter layer dielectric. According to the present invention, the polishing slurry can be provided as a polishing slurry that can retain its preservative property over a period of time of a year or longer.

As the "aqueous medium", may be used only water. However, a mixed medium comprising water as a main component, such as a combination of water and methanol, may also be used. It is particularly preferred that only water be used as the aqueous medium.

In the preparation of a polishing slurry, it has heretofore been necessary to contain the respective components into water just before use because of the putrefactive problem. Accordingly, there have been such problems that a complicated polishing slurry feeding system is required, and the composition of the polishing slurry also becomes unstable. On the other hand, the polishing slurry for chemical mechanical polishing according to the present invention has excellent preservative property and involves no putrefactive problem. It is thus possible to prepare a polishing slurry in high concentration in advance and to use it by dilute with the aqueous medium upon use. Therefore, the polishing slurry having a stable composition can be provided without a complicated polishing slurry feeding system. When the polishing slurry is diluted with the aqueous medium, the dilution rate thereof may be determined to be at least 2 times, that means the quantity of the diluent is the equal volume to the polishing slurry to be dililuted, preferably at least 5 times, particularly at least 10 times (generally at most 30 times).

Various kinds of additives can be contained into the polishing slurry according to the present invention to improve its performance. An inorganic acid is contained, whereby the polishing slurry can be stabilized, and selectivity in an STI step may also be improved in some cases. No particular limitation is imposed on the inorganic acid, and examples thereof include nitric acid, hydrochloric acid and sulfuric acid. These inorganic acids may be used either singly or in any combination thereof. The inorganic acid may also be used in combination with the organic acid described above. The inorganic acid may be contained in a proportion of 0.02 to 2 parts by mass, particularly 0.05 to 1 part by mass when the total proportion of the aqueous medium, ceria particles, preservative and organic component is 100 parts by mass.

A basic substance is additionally contained into the polishing slurry to control the pH thereof, whereby dispersibility, removal rate, and selectivity in a STI step such as removal rate can be further improved. No particular limitation is imposed on the basic substance, and any of an organic basic substance and an inorganic basic substance may also be used. Examples of the organic basic substance include nitrogen-containing organic compound such as ethylenediamine and ethanolamine. Examples of the inorganic basic substance include ammonia, potassium hydroxide, sodium hydroxide and lithium hydroxide. These basic substances may be used either singly or in any combination thereof. The organic basic substance and the inorganic basic substance may also be used in combination. The amount of the basic substance contained is important from the viewpoint of adjusting the pH of the polishing slurry aqueous dispersion, and may be controlled to 0.01 to 1 part by mass, particularly 0.02 to 0.5 parts by mass when the total proportion of the aqueous medium, ceria particles, preservative and organic component is 100 parts by mass.

Into the polishing slurry, other additives may be additionally contained as needed within limits not impairing the preservative property thereof. Examples of the other additives include oxidizing agents such as hydrogen peroxide, persulfates and heteropolyacid, and ions of polyvalent metals such as aluminum, titanium, vanadium, chromium and iron.

The aqueous dispersion or polishing slurry for chemical mechanical polishing according to the present invention can be used in a neutral range suitable for the ceria particles, is excellent in preservative property and also sufficiently has an action to prevent scratches and control to restrain dishing.

More specifically, when chemical mechanical polishing is carried out at a pH of 7.5 to 9 under conditions in Examples, which will be described subsequently, to make a performance evaluation, no bacteria were detected, scratches could be reduced to at most 20 counts, particularly at most 15 counts, more preferably at most 10 counts, and dishing could be lessened to at most 250 nm, particularly at most 200 nm, more preferably at most 150 nm. When the amount of the ceria particles contained is 3 to 15% by mass, the amount of the preservative contained is 0.003 to 0.12% by mass, and the amount of the organic component contained is 3 to 30% by mass, no bacteria were detected, scratches could be reduced to at most 10 counts, particularly at most 5 counts, more preferably at most 3 counts, and dishing could be lessened to at most 150 nm, particularly at most 100 nm, more preferably at most 70 nm.

When a surface to be polished is subjected to chemical mechanical polishing with the polishing slurry for chemical mechanical polishing, a commercially available chemical mechanical polishing apparatus (Model "EPO-112", Model "EPO-222" or the like, manufactured by Ebara Corporation; Model "LGP-510", Model "LGP-552" or the like, manufactured by Lap Master SFT Co.; trade name "Mirra", manufactured by Applied Materials Inc.; trade name "Teres, manufactured by Lam Research Co.; or Model "AVANTI 472" or the like, manufactured by Speed Fam-IPEC Co.) can be used to conduct polishing under prescribed conditions.

EXAMPLE

The present invention will hereinafter be described specifically by the following Examples.

Example 1

After 35 parts by mass of ceria particles were added into 65 parts by mass of ion-exchanged water, and the pH of the resultant mixture was adjusted to 5 with nitric acid, the mixture was then treated by means of a bead mill (manufactured by Ashizawa K.K.) using zirconia beads having a diameter of 1 mm as a medium and then filtered through a filter having a pore size of 5 $\mu$m. Thereafter, ion-exchanged water, potassium polyacrylate having a molecular weight of 6,000 and 2-methyl-4-isothiazol-3-one were further contained to prepare a polishing slurry for chemical mechanical polishing containing 10% by mass of the ceria particles as inorganic abrasive grains, 25% by mass of potassium polyacrylate as an organic component, 0.004% by mass of 2-methyl-4-isothiazol-3-one as a preservative and ion-exchanged water constitute the rest. The polishing slurry was diluted 10 to 20 times in terms of mass with ion-exchanged water to use in evaluation as to polishing performance and putrefactive tendency (the number of bacteria).

The polishing performance of this polishing slurry was evaluated in the following manner.

(1) Removal Rate

A patterned wafer (product of SKW Co., trade name "SKW-7", line width: 250 $\mu$m, thickness of laminate film of insulating material: 2,000 nm, initial step height: 900 nm) was polished by means of a chemical mechanical polishing apparatus (Model "EPO-112", manufactured by Ebara Corporation) under the following conditions to calculate out a removal rate from a film thickness reduced by the polishing and a polishing time required.

① Polishing pad: trade name "1C1000/SUBA 400", product of Rodel Nitta Ltd.)

② Load: 400 g/cm$^2$

③ Table rotating speed: 70 rpm
④ Head rotating speed: 70 rpm
⑤ Polishing slurry feeding rate: 200 ml/min
⑥ Polishing time: 3 minutes.

(2) Scratch

After an 8-inch thermal oxidation film wafer was polished in the same manner as the item (1), for 2 minutes measurement was conducted by means of a wafer surface dust particle inspection apparatus (Model "KLA2112", manufactured by KLA-Tencor Co.).

(3) Dishing

After a wafer was overpolished by 15% in terms of the period of time in the evaluation of removal rate of the item (1), a step height was measured thereby measured on a dishing at a place of a line width of 250 μm by means of a microform measuring apparatus (Model "P-10", manufactured by KLA-Tencor Co.).

(4) Number of Bacteria

Measurement was conducted in accordance with the simple inspection method prescribed by DAIICHI KOGYO CO., LTD. Industrial water not sterilized was used to prepare an aqueous solution of potassium polycarboxylate at a concentration of 1% by mass and a pH 7. The aqueous solution was then left to stand for 28 days at 35° C. to prepare a putrefied model aqueous solution containing 1,000 bacteria. This putrefied model aqueous solution and an aqueous dispersion to be evaluated as to putrefactive property were then mixed at a mass ratio of 1:9 to culture the resultant mixture at 35° C. for 7 days and then count the number of bacteria in accordance with the simple inspection method.

Examples 2 to 16 and Comparative Examples 1 to 7

Ceria particles, an organic component and a preservative (not contained in Comparative Examples 1 and 5 to 7) of their corresponding kinds and contents shown in Table 1 were contained into ion-exchanged water to prepare polishing slurries. These polishing slurries were used to evaluate them as to polishing performance and preservative property as in example 1. The results are shown together with the results of Example 1 in Table 2.

TABLE 1

| | | Ceria Particle (Inorganic abrasive grains) | | Organic component | | Preservative | |
|---|---|---|---|---|---|---|---|
| | | Average Particle Diameter (μm) | Content (mass %) | Kind | Content (mass %) | Kind | Content (mass %) |
| Example | 1 | 0.26 | 10 | PAA-K | 25 | H-MIT | 0.004 |
| | 2 | | | | | | 0.02 |
| | 3 | | | | | | 0.1 |
| | 4 | | | | | BIT | 0.02 |
| | 5 | 0.22 | | 0.2 μmP-MMA particle | 15 | H-MIT | 0.004 |
| | 6 | | | | | | 0.02 |
| | 7 | | | | | | 0.1 |
| | 8 | | | | | BIT | 0.02 |
| | 9 | 0.31 | | ammonium citrate | 10 | H-MIT | 0.004 |
| | 10 | | | | | | 0.02 |
| | 11 | | | | | | 0.1 |
| | 12 | | | | | BIT | 0.02 |
| | 13 | 0.14 | 5 | DBS-NH$_4$ | 5 | H-MIT | 0.004 |
| | 14 | | | | | | 0.02 |
| | 15 | | | | | | 0.1 |
| | 16 | | | | | BIT | 0.02 |
| Comparative Example | 1 | 0.26 | 10 | PAA-K | 25 | — | 0 |
| | 2 | | | | | H$_2$O$_2$ | 0.002 |
| | 3 | | | | | TMA-CI | 0.1 |
| | 4 | | | | | TEA-OH | |
| | 5 | 0.22 | | 0.2 μmP-MMA particle | 15 | — | 0 |
| | 6 | | | 0.31 | ammonium citrate | 10 | |
| | 7 | | | 0.14 | 5 | DBS-NH$_4$ | 5 |

TABLE 2

| | | pH | Dilution Rate (times) | Removing rate (nm/minute) | Scratch (count) | Dishing (nm) | Number of Bacteria |
|---|---|---|---|---|---|---|---|
| Example | 1 | 8.5 | 20 | 80 | 2 | 60 | Not Counted |
| | 2 | | | 45 | 0 | 55 | |
| | 3 | | | 55 | 0 | 65 | |
| | 4 | | 18 | 53 | 0 | 65 | |
| | 5 | | 20 | 320 | 0 | 85 | |
| | 6 | | | 320 | 1 | 83 | |
| | 7 | | | 320 | 0 | 79 | |
| | 8 | | 15 | 320 | 0 | 90 | |
| | 9 | | 20 | 280 | 0 | 95 | |
| | 10 | | | 250 | 0 | 99 | |
| | 11 | | | 240 | 0 | 89 | |
| | 12 | | 15 | 256 | 0 | 83 | |
| | 13 | 8.3 | 10 | 89 | 0 | 59 | |
| | 14 | 8 | | 92 | 0 | 60 | |
| | 15 | 7.9 | | 82 | 0 | 49 | |

TABLE 2-continued

| | pH | Dilution Rate (times) | Removing rate (nm/minute) | Scratch (count) | Dishing (nm) | Number of Bacteria |
|---|---|---|---|---|---|---|
| 16 | 8.2 | | 55 | 0 | 56 | |
| Comparative Example 1 | 8.4 | 20 | 80 | 14 | 60 | >10000 |
| 2 | 8.5 | | 82 | 155 | 70 | >1000 |
| 3 | 8.2 | | 74 | 21 | 310 | Not Counted |
| 4 | 8.8 | 20 | 73 | 32 | 340 | |
| 5 | 8.4 | | 320 | 2 | 85 | >10000 |
| 6 | 8.2 | | 210 | 35 | 88 | >1000 |
| 7 | 8 | 10 | 69 | 75 | 57 | >10000 |

In Table 2, "H-MIT", "BIT", "TMA-CL" and "TEA-OH" in the column of Preservative mean 2-methyl-4-isothiazol-3-one, the KOH salt of 1,2-benzoisothiazol-3-one, tetramethyl-ammonium chloride (Comparative Example 3) and tetraethyl-ammonium hydroxide (Comparative Example 4), respectively. "PAA-K" and "DBS-NH$_4$" in the column of Organic component mean potassium polyacrylate and ammonium dodecylbenzene-sulfonate, respectively.

According to Table 2, it is understood that in Comparative Examples 1, 5 and 7 in which no preservative was contained, no problem arises on removal rate and dishing, but scratches are caused in plenty except for Comparative Example 5, and all of them are very poor in preservative property as demonstrated by the number of bacteria exceeding 10,000. In Comparative Example 6 in which no preservative was contained likewise, no problem arises on removal rate and dishing, but scratches are caused in plenty, and the polishing slurry is comparatively poor in preservative property as demonstrated by the number of bacteria exceeding 1,000. It is also understood that in Comparative Example 2 in which hydrogen peroxide heretofore used as a preservative was contained, no problem arises on removal rate and dishing, but scratches are caused in great plenty, and the polishing slurry is comparatively poor in preservative property as demonstrated by the number of bacteria exceeding 1,000. It is further understood that in Comparative Examples 3 and 4 in which other preservatives not included in the present invention were respectively contained, no problem arises on preservative property, but scratches are caused in comparative plenty, and the polishing slurry are very poor in dishing cousing property.

It is further understood that in Examples 1 to 16 on the other hand, the polishing slurry have sufficient polishing performance though the polishing performance varies according to the average particle diameter of the ceria particles, the kind of the organic component, the kind of the preservative and the amounts of these components contained as demonstrated by the fact that removal rate is at least 45 nm/min, no scratches are counted in most cases, scratches are 2 counts at the most, and dishing is also at most 99 nm. It is also understood that no bacteria are detected in all the cases, and so the polishing slurries have excellent preservative property in combination.

[Effect of the Invention]

The aqueous dispersions for chemical mechanical polishing according to the present invention do not putrefy even when they are used in a neutral range, scarcely cause scratches, can form a sufficiently planarized polished surface and have excellent removal rate.

When an isothiazolone compound is used as a preservative, far excellent preservative property is achieved.

When the pH is 4 to 10, the putrefaction of an aqueous dispersion, in which the ceria particles have been contained, can be sufficiently prevented, and so there is no need to adjust the system to strongly acidic or strangely alkaline.

When a water-soluble polymer having a molecular weight of at least 100 is used as the organic component, an aqueous dispersion far excellent in planarizing performance can be provided.

In addition, the respective components can be contained with aqueous medium in advance because the resulting aqueous dispersion is excellent in preservative property, and the aqueous dispersion can be used by diluting it with an aqueous medium upon use. Accordingly, there is no need to contain the respective components upon use like the conventional aqueous dispersion, and so a complicated aqueous dispersion-feeding system becomes unnecessary, and the composition of the aqueous dispersion is stabilized to become excellent in the reproducibility of polishing performance.

When the aqueous dispersion is used in a micro isolating step or a planarizing step of an inter layer dielectric in production of semiconductor devices, the action and effect of this aqueous dispersion, such as excellent polishing performance, can be sufficiently exhibited.

What is claimed is:

1. An aqueous dispersion for chemical mechanical polishing comprising ceria particles, a preservative comprising an isothiazolone compound, and an organic component comprising at least one of (i) organic abrasive grains comprising resin particles, and (ii) a water-soluble polymer having a molecular weight of at least 100, contained in an aqueous medium, wherein the ceria particles, preservative and organic components are contained in proportions of 0.1 to 20% by mass, 0.001 to 0.2% by mass and 0.1 to 30% by mass, respectively, when the total proportion of the aqueous medium, the ceria particles, the preservative and the organic component is 100% by mass.

2. The aqueous dispersion for chemical mechanical polishing according to claim 1, wherein the ceria particles have an average particle diameter of 0.01 to 3 $\mu$m.

3. The aqueous dispersion for chemical mechanical polishing according to claim 1, wherein the preservative is 1,2-benzoisothiazol-3-one.

4. The aqueous dispersion for chemical mechanical polishing according to claim 1, wherein the ceria particles have an average particle diameter of 0.01 to 3 $\mu$m and the preservative is 1,2-benzoisothiazol-3-one.

5. The aqueous dispersion for chemical mechanical polishing according to claim 1, wherein the dispersion has a pH of 4–10.

6. The aqueous dispersion for chemical mechanical polishing according to claim 2, wherein the dispersion has a pH of 4–10.

7. The aqueous dispersion for chemical mechanical polishing according to claim 3, wherein the dispersion has a pH of 4–10.

8. The aqueous dispersion for chemical mechanical polishing according to claim 4, wherein the dispersion has a pH of 4–10.

9. A process comprising chemical mechanical polishing a surface of a wafer with an aqueous dispersion comprising ceria particles, a preservative comprising an isothiazolone compound, and an organic component comprising at least one of (i) organic abrasive grains comprising resin particles, and (ii) a water-soluble polymer having a molecular weight of at least 100, contained in an aqueous medium, wherein the ceria particles, preservative and organic component are contained in proportions of 0.1 to 20% by mass, 0.001 to 0.2% by mass and 0.1 to 30% by mass, respectively, when the total proportion of the aqueous medium, the ceria particles, the preservative and the organic component is 100% by mass.

10. The process of chemical mechanical polishing according to claim 9, wherein the ceria particles in the dispersion have an average particle diameter of 0.01 to 3 μm.

11. The process of chemical mechanical polishing according to claim 9, wherein the preservative in the dispersion is 1,2-benzoisothiazol-3-one.

12. The process of chemical mechanical polishing according to claim 9, wherein the ceria particles in the dispersion have an average particle diameter of 0.01 to 3 μm and the preservative in the dispersion is 1,2-benzoisothiazol-3-one.

13. The process of chemical mechanical polishing according to claim 9, wherein the dispersion is used in dilution at a dilution rate of at least 2 times with an aqueous medium upon use.

14. The process of chemical mechanical polishing according to claim 10, wherein the dispersion is used in dilution at a dilution rate of at least 2 times with an aqueous medium upon use.

15. The process of chemical mechanical polishing according to claim 11, wherein the dispersion is used in dilution at a dilution rate of at least 2 times with an aqueous medium upon use.

16. The process of chemical mechanical polishing according to claim 12, wherein the dispersion is used in dilution at a dilution rate of at least 2 times with an aqueous medium upon use.

17. The process of chemical mechanical polishing according to claim 9, wherein the process is conducted in a micro isolating step or a planarizing step of an inter layer dielectric in production of semiconductor devices.

18. The process of chemical mechanical polishing according to claim 10, wherein the process is conducted in a micro isolating step or a planarizing step of an inter layer dielectric in production of semiconductor devices.

19. The process of chemical mechanical polishing according to claim 11, wherein the process is conducted in a micro isolating step or a planarizing step of an inter layer dielectric in production of semiconductor devices.

20. The process of chemical mechanical polishing according to claim 12, wherein the process is conducted in a micro isolating step or a planarizing step of an inter layer dielectric in production of semiconductor devices.

* * * * *